(12) United States Patent
Gao et al.

(10) Patent No.: US 12,490,514 B2
(45) Date of Patent: Dec. 2, 2025

(54) DISPLAY SUBSTRATE, PREPARATION METHOD THEREOF, AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Le Gao, Beijing (CN); Liman Peng, Beijing (CN); Hongyu Mi, Beijing (CN); Qianqian Zhang, Beijing (CN); Xiaofeng Yan, Beijing (CN); Lingling Ma, Beijing (CN); Zhiyong Xue, Beijing (CN)

(73) Assignees: Ordos Yuansheng Optoelectronics Co., Ltd., Inner Mongolia (CN); Beijing BOE Technology Development Co., Ltd., Beijing (CN)

( * ) Notice: Subject to any disclaimer, the term of this patent is extended or adjusted under 35 U.S.C. 154(b) by 1039 days.

(21) Appl. No.: 17/612,207

(22) PCT Filed: Jan. 20, 2021

(86) PCT No.: PCT/CN2021/072837
§ 371 (c)(1),
(2) Date: Nov. 17, 2021

(87) PCT Pub. No.: WO2022/155806
PCT Pub. Date: Jul. 28, 2022

(65) Prior Publication Data
US 2023/0361132 A1   Nov. 9, 2023

(51) Int. Cl.
*H10D 86/60* (2025.01)
*G01R 31/28* (2006.01)
(Continued)

(52) U.S. Cl.
CPC ......... *H10D 86/60* (2025.01); *G01R 31/2884* (2013.01); *H10D 86/021* (2025.01); *H10D 86/443* (2025.01)

(58) Field of Classification Search
CPC ........................... H10D 86/60; G01R 31/2884
See application file for complete search history.

(56) References Cited

U.S. PATENT DOCUMENTS 6,686,758 B1   2/2004   Farnworth et al.
10,152,159 B2 *  12/2018   Cao ...................... G06F 3/0445
(Continued)

FOREIGN PATENT DOCUMENTS

CN   105044940 A   11/2015
CN   105096780 A   11/2015
(Continued)

OTHER PUBLICATIONS

Jing Li et al., Design of a Single-Pin Trimming Circuit, Semiconductor Technology, Nov. 2020, 828-833, vol. 45, No. 11.

*Primary Examiner* — Mounir S Amer
(74) *Attorney, Agent, or Firm* — Ling Wu; Stephen Yang; Ling and Yang Intellectual Property

(57) ABSTRACT

A display substrate includes an underlay substrate, a test signal access pin layer, and a signal access pin layer. The underlay substrate includes a display region and a border region at a periphery of the display region. The border region includes a signal access region at one side of the display region and at least one test signal access region adjacent to the signal access region. The test signal access pin layer is in the at least one test signal access region. The signal access pin layer is in the signal access region. A height difference between a surface of the test signal access pin layer away from the underlay substrate and a surface of the signal access pin layer away from the underlay substrate is greater than 0.

18 Claims, 5 Drawing Sheets

(51) Int. Cl.
*H10D 86/01* (2025.01)
*H10D 86/40* (2025.01)

(56) References Cited

U.S. PATENT DOCUMENTS

| | | | |
|---|---|---|---|
| 2008/0039585 | A1 | 2/2008 | Nishioka et al. |
| 2017/0153522 | A1 | 6/2017 | Zhao et al. |
| 2018/0294283 | A1* | 10/2018 | Liu .................. H01L 22/32 |
| 2019/0116672 | A1 | 4/2019 | Zhao et al. |

FOREIGN PATENT DOCUMENTS

| | | |
|---|---|---|
| CN | 105282987 A | 1/2016 |
| CN | 105307388 A | 2/2016 |
| CN | 108122804 A | 6/2018 |
| CN | 108401360 A | 8/2018 |
| CN | 109448617 A | 3/2019 |
| CN | 111443539 A | 7/2020 |
| EP | 1014096 A2 | 6/2000 |
| IN | 110867139 A | 3/2020 |
| JP | 2006152148 A | 6/2006 |
| TW | 200624503 A | 7/2006 |

\* cited by examiner

DISPLAY SUBSTRATE, PREPARATION METHOD THEREOF, AND DISPLAY DEVICE

CROSS-REFERENCE TO RELATED APPLICATION

The present application is a U.S. National Phase Entry of International Application No. PCT/CN2021/072837 having an international filing date of Jan. 20, 2021, the entire content of which is hereby incorporated by reference.

TECHNICAL FIELD

The present disclosure relates to, but not limited, to the technical field of display, and particularly to a display substrate, a preparation method thereof, and a display device.

BACKGROUND

With the constant development of a display technology, more and more types of display products have emerged, e.g., a Liquid Crystal Display (LCD), an Organic Light-Emitting Diode (OLED) display, a Plasma Display Panel (PDP), and a Field Emission Display (FED).

SUMMARY

The below is a summary about the subject matter described in the present disclosure in detail. The summary is not intended to limit the scope of protection of the claims.

The embodiments of the present disclosure provide a display substrate, a preparation method thereof, and a display device.

According to an aspect, an embodiment of the present disclosure provides a display substrate, which includes an underlay substrate, a test signal access pin layer, and a signal access pin layer. The underlay substrate includes a display region and a border region at a periphery of the display region. The border region includes a signal access region at one side of the display region and at least one test signal access region adjacent to the signal access region. The test signal access pin layer is in the at least one test signal access region. The signal access pin layer is in the signal access region. A height difference between a surface of the test signal access pin layer away from the underlay substrate and a surface of the signal access pin layer away from the underlay substrate is greater than 0.

In some exemplary implementation modes, the signal access pin layer includes multiple signal access pins arranged abreast in parallel. The at least one test signal access region is at at least one side of the multiple signal access pins in an arrangement direction of the multiple signal access pins.

In some exemplary implementation modes, the test signal access pin layer includes multiple test signal access pins, arranged in parallel with the multiple signal access pins.

In some exemplary implementation modes, the abovementioned display substrate further includes a first insulating layer, arranged in the at least one test signal access region and located on a side of the test signal access pin layer close to the underlay substrate. A projection of the first insulating layer on the underlay substrate includes a projection of the test signal access pin layer on the underlay substrate.

In some exemplary implementation modes, the first insulating layer includes multiple mutually isolated insulating portions in one-to-one correspondence with multiple test signal access pins of the test signal access pin layer. A projection of an insulating portion on the underlay substrate includes a projection of a corresponding test signal access pin on the underlay substrate.

In some exemplary implementation modes, the first insulating layer is an inorganic insulating layer.

In some exemplary implementation modes, the abovementioned display substrate further includes a second insulating layer, arranged in the test signal access region and the signal access region and located on sides of the test signal access pin layer and the signal access pin layer close to the underlay substrate. A thickness of the second insulating layer in the test signal access region is greater than that in the signal access region.

In some exemplary implementation modes, the second insulating layer is an inorganic insulating layer.

In some exemplary implementation modes, the test signal access pin layer includes multiple test signal access pin sub-layers which are stacked and mutually connected. The signal access pin layer includes multiple signal access pin sub-layers which are stacked and mutually connected. The multiple test signal access pin sub-layers are in one-to-one correspondence with the multiple signal access pin sub-layers. The test signal access pin sub-layer and the corresponding signal access pin sub-layer are in a same layer.

In some exemplary implementation modes, a thickness of the test signal access pin layer is greater than that of the signal access pin layer.

In some exemplary implementation modes, the height difference between the surface of the test signal access pin layer away from the underlay substrate and the surface of the signal access pin layer away from the underlay substrate is about 1,500 to 4,500 angstroms.

In some exemplary implementation modes, the display region at least includes a driving structure layer arranged on the underlay substrate. The driving structure layer includes a semiconductor layer, first gate metal layer, second gate metal layer, and source and drain metal layer which are sequentially arranged on the underlay substrate. The test signal access pin layer includes a first test signal access pin sub-layer and second test signal access pin sub-layer which are stacked and mutually connected. The signal access pin layer includes a first signal access pin sub-layer and second signal access pin sub-layer which are stacked and mutually connected. The first test signal access pin sub-layer, the first signal access pin sub-layer, and the first gate metal layer are in a same layer. The second test signal access pin sub-layer, the second signal access pin sub-layer, and the source and drain metal layer are in a same layer.

According to another aspect, an embodiment of the present disclosure provides a display device, which includes the abovementioned display substrate.

According to another aspect, an embodiment of the present disclosure provides a preparation method of a display substrate, which is used for preparing the abovementioned display substrate and includes: forming a test signal access pin layer in a test signal access region of an underlay substrate, and forming a signal access pin layer in a signal access region of the underlay substrate. A height difference between a surface of the test signal access pin layer away from the underlay substrate and a surface of the signal access pin layer away from the underlay substrate is greater than 0.

In some exemplary implementation modes, the abovementioned preparation method further includes: forming a first insulating layer in the test signal access region before the test signal access pin layer is formed. A projection of the first insulating layer on the underlay substrate includes a projection of the test signal access pin layer on the underlay substrate.

In some exemplary implementation modes, the above-mentioned preparation method further includes: forming a second insulating layer in the signal access region and the test signal access region before the test signal access pin layer and the signal access pin layer are formed. A thickness of the second insulating layer in the test signal access region is greater than that in the signal access region.

In some exemplary implementation modes, a thickness of the test signal access pin layer is greater than that of the signal access pin layer.

After the drawings and the detailed description are read and understood, the other aspects may be comprehended.

BRIEF DESCRIPTION OF DRAWINGS

The drawings provide a further understanding to the technical solution of the present disclosure, form a part of the specification, and are adopted to explain, together with the embodiments of the present disclosure, the technical solutions of the present disclosure and not intended to form limits to the technical solutions of the present disclosure. The shapes and sizes of one or more components in the drawings do not reflect the true scale, and are only intended to schematically describe the contents of the present disclosure.

DETAILED DESCRIPTION

Figure 1:
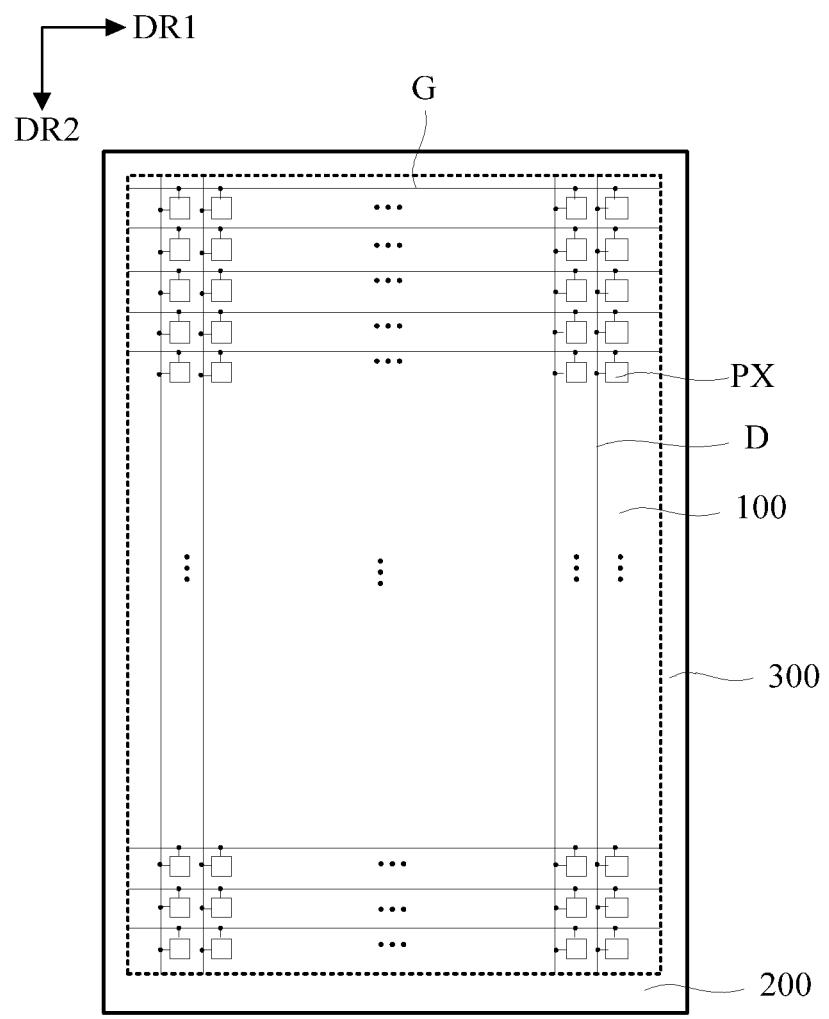
FIG. 1 is a schematic diagram of a display substrate according to at least one embodiment of the present disclosure.

The embodiments of the present disclosure will be described below in combination with the drawings in detail. The implementation modes may be implemented in various forms. Those of ordinary skill in the art can easily understand such a fact that manners and contents may be transformed into one or more forms without departing from the purpose and scope of the present disclosure. Therefore, the present disclosure should not be explained as being limited to the contents recorded in the following implementation modes only. The embodiments in the present disclosure and the features in the embodiments can be freely combined without conflicts.

In the drawings, the size/sizes of one or more composition elements, the thicknesses of layers, or regions are exaggerated sometimes for clarity. Therefore, a mode of the present disclosure is not always limited to the size, and the shapes and sizes of each component in the drawings do not reflect the true scale. In addition, the drawings schematically illustrate ideal examples, and a mode of the present disclosure is not limited to the shapes, numerical values, or the like shown in the drawings.

Ordinal numerals "first", "second", and "third" in the present disclosure are set not to form limits in number but only to avoid the confusion of composition elements. In the present disclosure, "multiple" represents two or more than two.

In the present disclosure, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the present specification, and thus should not be understood as limits to the present disclosure. The positional relationships between the composition elements may be changed as appropriate according to the direction where the composition elements are described. Therefore, appropriate replacements based on situations are allowed, not limited to the expressions in the specification.

In the present disclosure, unless otherwise specified and defined, terms "mounting", "mutual connection", and "connection" should be generally understood. For example, the term may be fixed connection, or detachable connection, or integral connection. The term may be mechanical connection or electric connection. The term may be direct connection, or indirect connection through an intermediate, or communication inside two elements. Those of ordinary skill in the art may understand the meanings of the terms in the present disclosure according to specific situations. Herein, "electric connection" includes connection of the composition elements through an element with a certain electric action. "The element with the certain electric action" is not particularly limited as long as electric signals between the connected composition elements may be sent and received. Examples of "the element with the certain electric action" not only include an electrode and a line, but also include a switch element such as a transistor, a resistor, an inductor, a capacitor, another element with one or more functions, etc.

In the present disclosure, the transistor refers to an element that at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. In the present disclosure, the channel region refers to a main region that the current flows through.

In the present disclosure, for distinguishing the two electrodes, except the gate, of the transistor, one electrode is called a first electrode, the other electrode is called a second electrode. The first electrode may be the source or the drain, and the second electrode may be the drain or the source. In addition, the gate of the transistor is called a control electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present disclosure.

In the present disclosure, "parallel" refers to a state that an angle formed by two straight lines is larger than −10° and smaller than 10°, and thus may include a state that the angle is larger than −5° and smaller than 5°. In addition, "perpendicular" refers to a state that an angle formed by two straight lines is larger than 80° and smaller than 100°, and thus may include a state that the angle is larger than 85° and smaller than 95°.

In the present disclosure, "film" and "layer" may be exchanged. For example, "conductive layer" may be replaced with "conductive film" sometimes. Similarly, "insulating film" may be replaced with "insulating layer" sometimes.

In the present disclosure, "about" refers to that a boundary is defined not so strictly and numerical values in process and measurement error ranges are allowed.

An Electronic Test (ET) is needed in a preparation process of a display substrate to detect whether there is any display defect (e.g., bright spot or dark spot) to filter a defective product. Taking an OLED display substrate as an example, after backboard circuit manufacturing, luminous material evaporation, and water and oxygen isolation packaging processes are completed for the OLED display substrate, an ET process is needed to filter a defective product to prevent the defective product from entering a back-end process to waste money and materials for the back-end process. Since a test signal access region is adjacent to a signal access region, a testing device may contact with a signal access pin in the signal access region to bruise or scratch the signal access pin when contacting with a test signal access pin on the display substrate through a test probe in the ET process. Alternatively, when the test probe of the testing device is aligned with the test signal access pin inaccurately, the test probe may be deviated to the signal access pin to bruise or scratch the signal access pin, resulting in a short-circuit of an adjacent signal access pin and an exception of the display substrate during subsequent use to cause a yield loss.

An embodiment of the present disclosure provides a display substrate, which includes an underlay substrate, a test signal access pin layer, and a signal access pin layer. The underlay substrate includes a display region and a border region at a periphery of the display region. The border region includes a signal access region at one side of the display region and at least one test signal access region adjacent to the signal access region. The test signal access pin layer is in the test signal access region. The signal access pin layer is in the signal access region. A height difference between a surface of the test signal access pin layer away from the underlay substrate and a surface of the signal access pin layer away from the underlay substrate is greater than 0.

In the present embodiment, a certain height difference is formed between the test signal access pin layer and the signal access pin layer, so that the surface of the test signal access pin layer away from the underlay substrate and the surface of the signal access pin layer away from the underlay substrate are in different planes.

In the present disclosure, "height" represents a vertical distance between two opposite surfaces. The height in the present disclosure may be based on a lower surface or upper surface of the underlay substrate. However, no limits are made thereto in the present embodiment.

According to the display substrate provided in the embodiment of the present disclosure, it is set that the height difference is formed between the test signal access pin layer and the signal access pin layer, so that a test probe of a testing device only contacts with the test signal access pin layer in an ET process, and the signal access pin layer is prevented from being bruised or scratched by the test probe. Therefore, the yield loss is reduced.

In some exemplary implementation modes, the display substrate of the present embodiment may be an Organic Light-Emitting Diode (OLED) display, a Liquid Crystal Display (LCD), a Plasma Display Panel (PDP), or a Field Emission Display (FED). However, the type of the display substrate is not limited in the present embodiment.

In some exemplary implementation modes, the height difference between the surface of the test signal access pin layer away from the underlay substrate and the surface of the signal access pin layer away from the underlay substrate is about 1,500 to 4,500 angstroms. However, no limits are made thereto in the present embodiment.

In some exemplary implementation modes, the signal access pin layer includes multiple signal access pins arranged abreast in parallel. The at least one test signal access region is at at least one side of the multiple signal access pins in an arrangement direction of the multiple signal access pins. For example, the border region includes two test signal access regions, and the two test signal access regions are on two opposite sides in the arrangement direction of the multiple signal access pins. However, no limits are made thereto in the present embodiment.

In some exemplary implementation modes, the test signal access pin layer includes multiple test signal access pins, arranged in parallel with the multiple signal access pins. In the present example, the multiple test signal access pins extend in the same direction as the multiple signal access pins, and an arrangement direction of the multiple test signal access pins is parallel to the arrangement direction of the multiple signal access pins.

The pad or pin in the embodiment of the present disclosure refers to a structure arranged to acquire a signal and lead the signal in a signal line in the display substrate. For example, the pin may be one or more flaky metal layers arranged on the underlay substrate. In some examples, the signal access pin is arranged to form a bonding connection with a Flexible Printed Circuit (FPC) or an Integrated Circuit (IC), thereby acquiring a signal from the flexible circuit board or the integrated circuit. At least part of signal access pins are arranged to provide data signals for data lines, namely at least part of signal access pins are arranged to provide data signals for data lines to control display contents of sub-pixels connected with the data lines when an image is displayed. At least part of signal access pins are arranged to provide power signals for power lines. At least part of signal access pins are arranged to provide clock signals. The test signal access pin is arranged to contact with the test probe of the testing device, thereby obtaining a signal from the test probe.

In some exemplary implementation modes, the display substrate of the present embodiment further includes a first insulating layer, arranged in the at least one test signal access region. The first insulating layer is on a side of the test signal access pin layer close to the underlay substrate. A projection of the first insulating layer on the underlay substrate includes a projection of the test signal access pin layer on the underlay substrate. In the present exemplary implementation mode, the first insulating layer is arranged in the test signal access region to form the height difference between the test signal access pin layer and the signal access pin layer.

In some exemplary implementation modes, the first insulating layer includes multiple mutually isolated insulating portions in one-to-one correspondence with multiple test signal access pins of the test signal access pin layer. A projection of an insulating portion on the underlay substrate includes a projection of a corresponding test signal access pin on the underlay substrate. In some examples, the projection of the insulating portion on the underlay substrate is overlapped with the projection of the corresponding test signal access pin on the underlay substrate. Alternatively, the projection of the insulating portion on the underlay substrate covers the projection of the corresponding test signal access pin on the underlay substrate. However, no limits are made thereto in the present embodiment. In some examples, the first insulating layer may cover the whole test signal access region.

In some exemplary implementation modes, the first insulating layer may be an inorganic insulating layer. However, no limits are made thereto in the present embodiment. For example, the first insulating layer may be an organic insulating layer.

In some exemplary implementation modes, the display substrate of the present embodiment may include a second insulating layer, arranged in the test signal access region and the signal access region. The second insulating layer is on sides of the test signal access pin layer and the signal access pin layer close to the underlay substrate. A thickness of the second insulating layer in the test signal access region is greater than that in the signal access region. In the present exemplary implementation mode, the second insulating layer in the test signal access region and the signal access region is set to be different in thickness to form the height difference between the test signal access pin layer and the signal access pin layer.

In the present disclosure, "thickness" represents a vertical distance between a surface of a film layer away from the underlay substrate and a surface close to the underlay substrate.

In some exemplary implementation modes, the second insulating layer is an inorganic insulating layer. In some examples, the second insulating layer is in the same layer as an interlayer insulating layer of the display region. However, no limits are made thereto in the present embodiment.

In some exemplary implementation modes, the test signal access pin layer includes multiple test signal access pin sub-layers which are stacked and mutually connected. The signal access pin layer includes multiple signal access pin sub-layers which are stacked and mutually connected. The multiple test signal access pin sub-layers are in one-to-one correspondence with the multiple signal access pin sub-layers. The test signal access pin sub-layer is in the same layer as the corresponding signal access pin sub-layer. The test signal access pin sub-layer and the corresponding signal access pin sub-layer may be prepared from the same material through the same patterning process. In some examples, the test signal access pin sub-layer includes multiple test signal access sub-pins, and the test signal access pin includes multiple test signal access sub-pins which are stacked and mutually connected. The signal access pin sub-layer includes multiple signal access sub-pins, and the signal access pin includes multiple signal access sub-pins which are stacked and mutually connected. However, no limits are made thereto in the present embodiment.

In some exemplary implementation modes, a thickness of the test signal access pin layer is greater than that of the signal access pin layer. In the present exemplary implementation mode, the test signal access pin layer and the signal access pin layer are set to be different in thickness to form the height difference between the test signal access pin layer and the signal access pin layer. For example, a thickness of a certain test signal access pin sub-layer of the test signal access pin layer is greater than that of the corresponding signal access pin sub-layer, and thicknesses of the other test signal access pin sub-layer are all the same as those of the corresponding signal access pin sub-layers. However, no limits are made thereto in the present embodiment.

In some exemplary implementation modes, the display region at least includes a driving structure layer arranged on the underlay substrate. The driving structure layer includes a semiconductor layer, first gate metal layer, second gate metal layer, and source and drain metal layer which are sequentially arranged on the underlay substrate. The test signal access pin layer includes a first test signal access pin sub-layer and second test signal access pin sub-layer which are stacked and mutually connected. The signal access pin layer includes a first signal access pin sub-layer and second signal access pin sub-layer which are stacked and mutually connected. The first test signal access pin sub-layer, the first signal access pin sub-layer, and the first gate metal layer are in the same layer. The second test signal access pin sub-layer, the second signal access pin sub-layer, and the source and drain metal layer are in the same layer. However, no limits are made thereto in the present embodiment.

The display substrate of the present embodiment will now be described with some examples. The display substrate is described in the following exemplary embodiments taking an OLED display substrate as an example.

FIG. 1 is a schematic diagram of a display substrate according to at least one embodiment of the present disclosure. As shown in FIG. 1, the display substrate provided in the present exemplary embodiment includes an underlay substrate. The underlay substrate includes a display region 100 and a border region at a periphery of the display region 100. The border region includes a first border region 200 at one side of the display region 100 and a second border region 300 at the periphery of the display region 100 and away from the first border region 200. The first border region 200 is connected with the second border region 300 to surround the display region 100. In some examples, the first border region 200 is a lower border of the underlay substrate, and the second border region 300 includes an upper border, left border, and right border of the underlay substrate. However, no limits are made thereto in the present embodiment.

In some exemplary implementation modes, the underlay substrate may substantially be shaped into a rectangle. As shown in FIG. 1, the underlay substrate may include a pair of long edges that are parallel to each other in a first direction DR1 and a pair of short edges that are parallel to each other in a second direction DR2. The first direction DR1 is perpendicular to the second direction DR2. However, the shape of the underlay substrate is not limited in the present embodiment. In some examples, the underlay substrate may be a closed polygon including linear edges, a round or ellipse including a curved edge, a half round or semi-ellipse including a linear edge and a curved edge, or the like. In some examples, at least some corners of the underlay substrate may be curves when the underlay substrate has linear edges. An intersection of adjacent linear edges may be replaced with a curve with a predetermined curvature when the underlay substrate is rectangular. The curvature may be set according to different positions of the curve. For example, the curvature may be changed according to a starting position of the curve, a length of the curve, etc.

In some exemplary implementation modes, as shown in FIG. 1, the display region 100 at least includes multiple sub-pixels PX, multiple gate lines G, and multiple data lines D. The multiple gate lines G extend in the first direction DR1, and the multiple data lines D extend in the second direction DR2. Orthographic projections of the multiple gate lines G and the multiple data lines D on the underlay substrate are intersected to form multiple sub-pixel regions, and a sub-pixel PX is arranged in each sub-pixel region. The multiple data lines D are electrically connected with the multiple sub-pixels PX and arranged to provide data signals for the multiple sub-pixels PX. The multiple gate lines G are electrically connected with the multiple sub-pixels PX and arranged to provide gate control signals for the multiple sub-pixels PX.

In some exemplary implementation modes, a pixel unit may include three sub-pixels, i.e., a red sub-pixel, a green sub-pixel, and a blue sub-pixel respectively. However, no limits are made thereto in the present embodiment. In some examples, a pixel unit may include four sub-pixels, i.e., a red sub-pixel, a green sub-pixel, a blue sub-pixel, and a white sub-pixel respectively.

In some exemplary implementation modes, a shape of the sub-pixel may be a rectangle, a rhombus, a pentagon, or a hexagon. When a pixel unit includes three sub-pixels, the three sub-pixels may be arranged in parallel in a horizontal direction, in parallel in a vertical direction, or in a Delta shape. When a pixel unit includes four sub-pixels, the four sub-pixels may be arranged in parallel in the horizontal direction, in parallel in the vertical direction, or in a square. However, no limits are made thereto in the present embodiment.

In some exemplary implementation modes, the sub-pixel may include a pixel driving circuit and an emitting element connected with the pixel driving circuit. The pixel driving circuit may include multiple transistors and at least one capacitor. For example, the pixel driving circuit may be of a 7T1C (seven transistors and one capacitor) or 5T1C structure. The emitting element may include a first electrode, a second electrode, and an organic layer between the first electrode and the second electrode. The first electrode of the emitting element may be connected with the corresponding pixel driving circuit.

In some exemplary implementation modes, a driving unit is arranged on the underlay substrate to provide a data signal for a sub-pixel through a data line and provide a gate control signal for the sub-pixel through a gate line. In some examples, the gate control signal includes a scanning signal and an emission signal.

Figure 2:
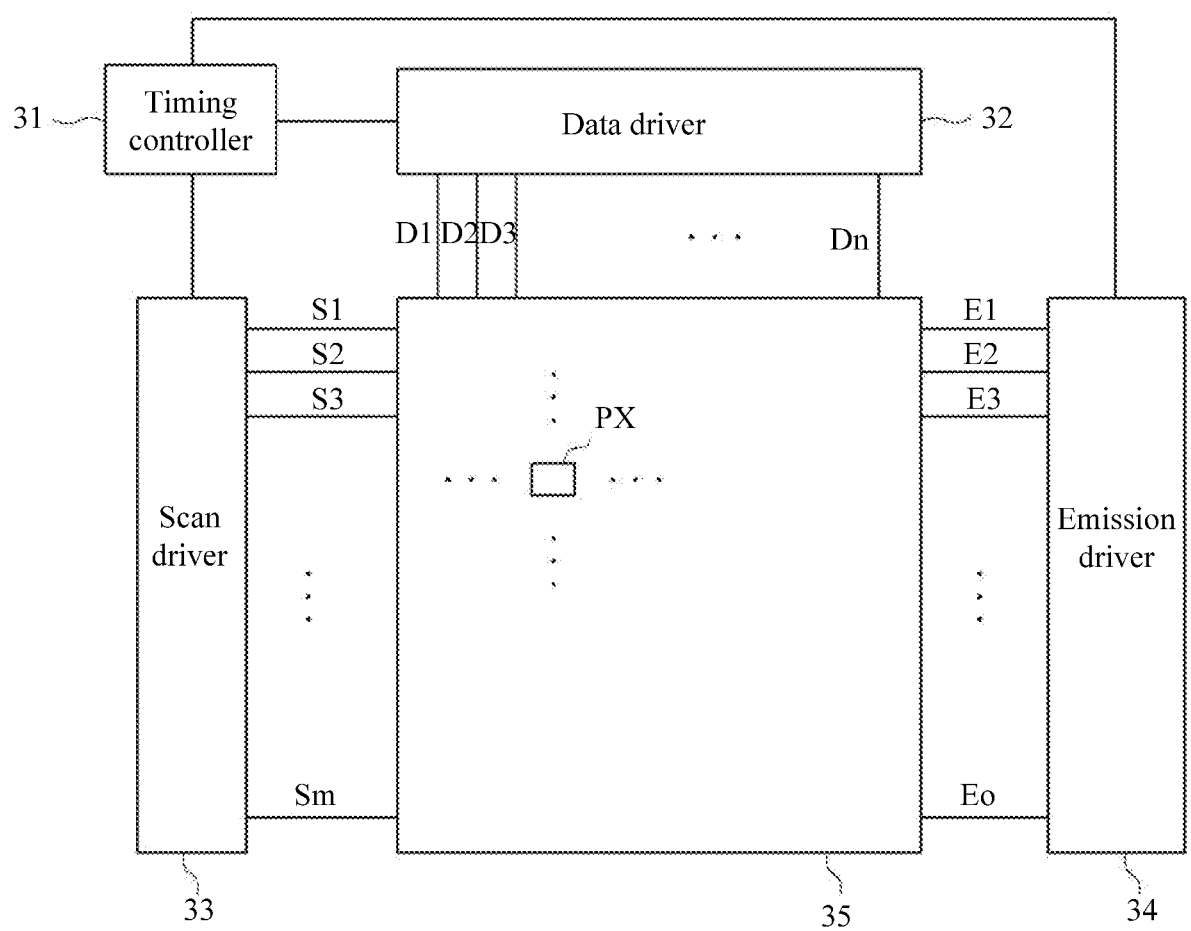
FIG. 2 is a schematic diagram of structure of a driving unit according to at least one embodiment of the present disclosure.

FIG. 2 is a schematic diagram of structure of a driving unit according to at least one embodiment of the present disclosure. In some exemplary implementation modes, as shown in FIG. 2, the driving unit includes a timing controller 31, a data driver 32, a scan driver 33, and an emission driver 34. A sub-pixel array 35 in the display region includes multiple sub-pixels PX which are regularly arranged. The scan driver 33 is arranged to provide a scanning signal for the sub-pixel along a scanning line. The data driver 32 is arranged to provide a data voltage for the sub-pixel along a data line. The emission driver 34 is arranged to provide an emission signal for the sub-pixel along an emission line. The timing controller 31 is arranged to control the scan driver 33, the emission driver 34, and the data driver 32.

In some exemplary implementation modes, the timing controller 31 may provide a gray-scale value and control signal suitable for a specification of the data driver 32 for the data driver 32. The timing controller 31 may provide a clock signal, scan starting signal, etc., suitable for a specification of the scan driver 33 for the scan driver 33. The timing controller 31 may provide a clock signal, emission stopping signal, etc., suitable for a specification of the emission driver 34 for the emission driver 34. The data driver 32 may generate a data voltage to be provided for data lines D1 to Dn using the gray-scale value and control signal received from the timing controller 31. For example, the data driver 32 may sample the gray-scale value using the clock signal and apply the data voltage corresponding to the gray-scale value to the data lines D1 to Dn taking sub-pixel row as the unit. The scan driver 33 may receive the clock signal, the scan starting signal, etc., from the timing controller 31 to generate a scanning signal to be provided for scanning lines Si to Sm. For example, the scan driver 33 may sequentially provide the scanning signal with a turn-on level pulse for the scanning lines. In some examples, the scan driver 33 may include a shift register and sequentially transmit the scan starting signal provided in form of a turn-on level pulse to a next-stage circuit to generate the scanning signal under the control of the clock signal. The emission driver 34 may receive the clock signal, the emission stopping signal, etc., from the timing controller 31 to generate an emission signal to be provided for emission lines E1 to Eo. For example, the emission driver 34 may sequentially provide the emission signal with a cut-off level pulse for the emission lines. The emission driver 34 may include a shift register to sequentially transmit the emission stopping signal provided in form of a cut-off level pulse to a next-stage circuit to generate the emission signal under the control of the clock signal. Herein, n, m, and o are all natural numbers.

In some exemplary implementation modes, the scan driver and the emission driver may be directly arranged on the underlay substrate. For example, the scan driver and the emission driver may be arranged in the second border region 300. In some examples, the scan driver and the emission driver may be formed together with the sub-pixels in a process of forming the sub-pixels. However, the positions or forming manner of the scan driver and the emission driver is not limited in the present embodiment. In some examples, the scan driver or the emission driver may be arranged on an independent chip or printed circuit board to be connected with a bonding pad or welding pad formed on the underlay substrate.

In some exemplary implementation modes, the data driver may be arranged on an independent chip or printed circuit board to be connected to the sub-pixel through the signal access pin on the underlay substrate. For example, the data driver may be formed and arranged in the first border region 200 using a chip on glass, a chip on plastics, a chip on film, etc., to be connected to the signal access pin on the underlay substrate. The timing controller may be arranged separately or integrally with the data driver. However, no limits are made thereto in the present embodiment. In some examples, the data driver may be directly arranged on the underlay substrate.

In some exemplary implementation modes, multiple test units are further arranged in the second border region 300. The multiple test units may be connected with multiple data lines, and are arranged to provide data test signals for the sub-pixels in the display region through the data lines. For example, the multiple test units may be arranged at a side of the display region away from the first border region. The multiple test units receive test signals from a test signal input region of the first border region through test lines. However, no limits are made thereto in the present embodiment. For example, the multiple test units may be arranged in the first border region and adjacent to the display region.

Figure 3:
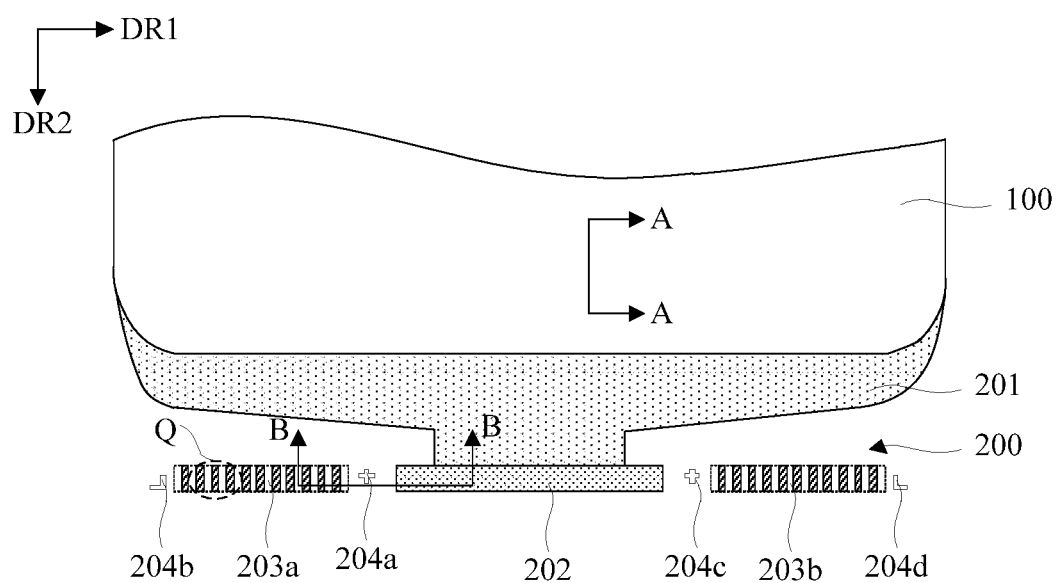
FIG. 3 is a schematic diagram of a first border region according to at least one embodiment of the present disclosure.

FIG. 3 is a schematic diagram of a first border region according to at least one embodiment of the present disclosure. In some exemplary implementation modes, as shown in FIG. 3, the first border region 200 includes a fan-out region 201 at one side of the display region 100, and a signal access region 202 and two test signal access regions (for example, a first test signal access region 203a and a second test signal access region 203b) at a side of the fan-out region 201 away from the display region 100. Both the first test signal access region 203a and the second test signal access region 203b are adjacent to the signal access region 202. Multiple signal access pins are arranged abreast in parallel in the signal access region 202. The multiple signal access pins are sequentially arranged in a first direction DR1. The first test signal access region 203a and the second test signal access region 203b are on two opposite sides of the signal access region 202 in the first direction DR1. In the present exemplary implementation mode, the two test signal access regions are arranged on the two opposite sides of the signal access region in the first direction, so that the first border region may not be too large, and a narrow border design is implemented. However, the number and positions of the test signal access regions are not limited in the present embodiment. In some examples, the test signal access region may be at a side of the signal access region away from the display region. In some examples, the first border region may include one test signal access region adjacent to the signal access region.

In some exemplary implementation modes, as shown in FIG. 3, a first alignment mark 204a is arranged between the first test signal access region 203a and the signal access region 202. a second alignment mark 204b is arranged at a side of the first test signal access region 203a away from the signal access region 202. A third alignment mark 204c is arranged between the second test signal access region 203b and the signal access region 202. A fourth alignment mark 204d is arranged at a side of the second test signal access region 203b away from the signal access region 202. The first alignment mark 204a and the third alignment mark 204c are crossed. The second alignment mark 204b is " ⌐ "-shaped. The fourth alignment mark 204d is " ⌙ "-shaped. However, no limits are made thereto in the present embodiment. In the present exemplary implementation mode, the alignment marks are arranged around the test signal access region to help align the test probe and the test signal access pin in the test signal access region accurately in the ET process. In some exemplary implementation modes, the first alignment mark to the fourth alignment mark may be in the same layer as a first gate metal layer of the display region. However, no limits are made thereto in the present embodiment.

In some exemplary implementation modes, multiple signal fan-out lines and multiple power lines are arranged in the fan-out region 201. The multiple signal fan-out lines include multiple data fan-out lines arranged to be correspondingly connected, e.g., correspondingly connected one to one, with the multiple data lines in the display region 100 in a fan-out wiring manner. The multiple power lines include a first power line and a second power line. The first power line is arranged to connect a high-voltage power line (VDD) of the display region 100. The second power line is arranged to connect a low-voltage power line (VSS) arranged in the first border region. In some examples, the first power line and the second power line are arranged in the same layer and arranged in different layers with the multiple data fan-out lines. Orthographic projections of the multiple data fan-out lines on the underlay substrate are partially overlapped with an orthographic projection of the first power line on the underlay substrate and an orthographic projection of the second power line on the underlay substrate. In some examples, the multiple data fan-out lines are sequentially arranged in the first direction DR1. The multiple data fan-out lines may be numbered according to an arrangement sequence, and odd data fan-out lines and even data fan-out lines are alternately arranged in sequence in the first direction DR1. The odd data fan-out lines and the even data fan-out lines may be arranged in different layers. For example, the odd data fan-out lines are in the same layer as the first gate metal layer of the display region, and the even data fan-out lines are in the same layer as a second gate metal layer of the display region. However, no limits are made thereto in the present embodiment. For example, the multiple data fan-out lines may be arranged in the same layer.

Figure 4:
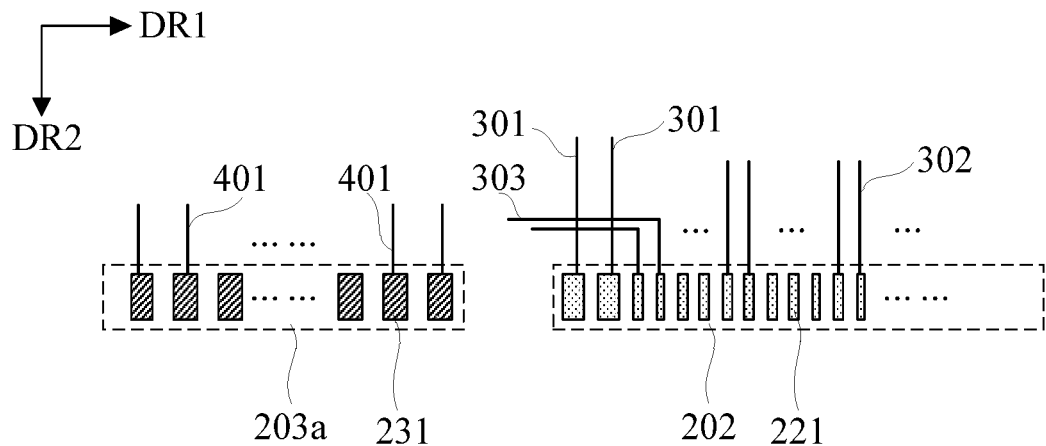
FIG. 4 is a schematic diagram of partial structure of a first border region according to at least one embodiment of the present disclosure.

FIG. 4 is a schematic diagram of partial structure of a first border region according to at least one embodiment of the present disclosure. In some exemplary implementation modes, as shown in FIG. 4, the signal access region 202 includes multiple signal access pins 221 sequentially arranged in the first direction DR1. The multiple signal access pins 221 are arranged to form bonding connections with a flexible printed circuit or an integrated circuit, thereby acquiring signals from the flexible circuit board or the integrated circuit. The multiple signal access pins may include multiple first signal access pins and multiple second signal access pins. The first signal access pins may be connected with power lines 301 of the fan-out region. At least part of second signal access pins may be connected with signal fan-out lines 302 of the fan-out region. At least part of second signal access pins may be connected with test units and scan drivers of the second border region through signal lines 303. In some examples, the multiple first signal access pins may be on two opposite sides of the multiple second signal access pins in the first direction DR1. The first signal access pin may be adjacent to the test signal access region. In some examples, a length of the first signal access pin in the first direction DR1 may be greater than that of the second signal access pin in the first direction DR1, and lengths of the first signal access pin and the second signal access pin in the second direction DR2 may be the same. In the present example, a size of the first signal access pin is larger than that of the second signal access pin. For example, the length of each second signal access pin in the first direction is about 14 microns (μm), the length of each first signal access pin in the first direction is about 90 μm, and a pitch between adjacent signal access pins is about 13 μm. However, no limits are made thereto in the present embodiment.

In some exemplary implementation modes, as shown in FIG. 4, multiple test signal access pins 231 sequentially arranged in the first direction DR1 are arranged in the first test signal access region 203a. The multiple test signal access pins 231 are arranged in parallel with the multiple signal access pins 221 in the signal access region 202. The multiple test signal access pins 231 are arranged to contact with the test probe of the testing device (e.g., a flexible circuit board) in the ET process, thereby obtaining signals from the test probe. In some examples, the test signal access pin of the first test signal access region 203a may be connected with the test unit and scan driver in the second border region through a first test line 401, and is arranged to provide a test signal for the test unit and the scan driver. However, no limits are made thereto in the present embodiment.

In some exemplary implementation modes, as shown in FIG. 4, lengths of the multiple test signal access pins 231 in the first direction DR1 may be the same, and lengths of the multiple test signal access pins 231 in the second direction DR2 may be the same. For example, the length of each test signal access pin 231 in the first direction DR1 is about 90 µm, and a pitch between adjacent test signal access pins 231 is about 62 µm. In the present exemplary implementation mode, sizes of the multiple test signal access pins may be the same. However, no limits are made thereto in the present embodiment.

In some exemplary implementation modes, as shown in FIG. 3, multiple test signal access pins sequentially arranged in the first direction DR1 are arranged in the second test signal access region 203b. At least part of test signal access pins in the second test signal access region 203b are connected with the test units and emission drivers in the second border region, and at least part of test signal access pins may be connected with part of signal access pins in the signal access region 202. The structure of the second test signal access pin 203b is similar to that of the first test signal access region 203a, and thus will not be elaborated herein.

In some exemplary implementation modes, a power signal may be provided for the display substrate in the ET process through the first signal access pin (i.e., a pin connected with the power line) in the signal access region. In the present example, the power signal may be provided using the first signal access pin in the signal access region in the ET process. However, no limits are made thereto in the present embodiment. For example, at least part of test signal access pins are connected with the power lines.

Figure 5:
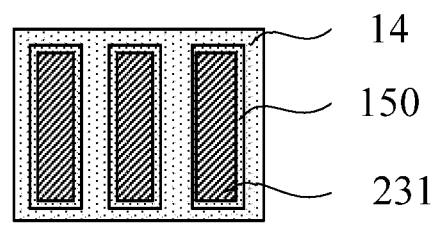
FIG. 5 is a schematic diagram of an enlarged view of the part of region Q in FIG. 3.
Figure 6:
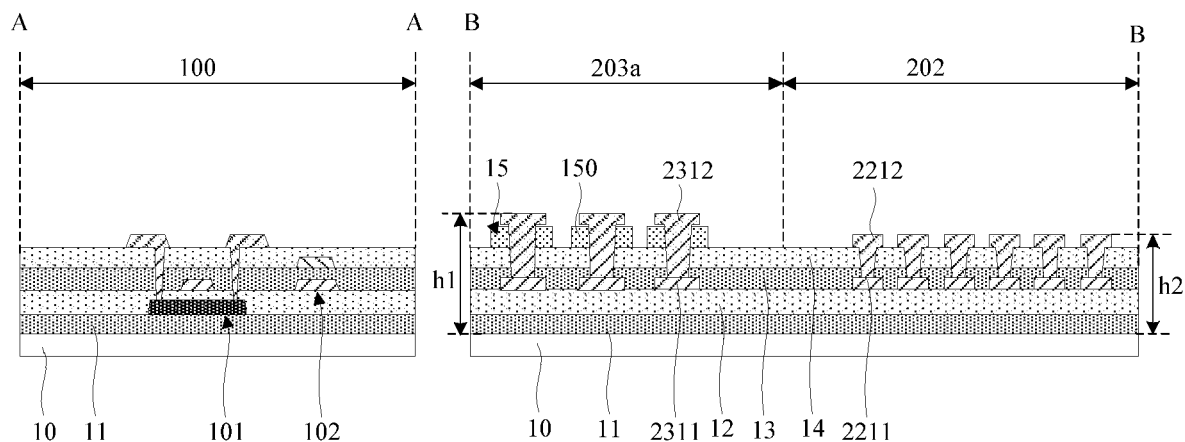
FIG. 6 is a schematic diagram of partial sectional views along A-A and B-B directions in FIG. 3.

FIG. 5 is a schematic diagram of an enlarged view of the part of region Q in FIG. 3. FIG. 6 is a schematic diagram of partial sectional views along A-A and B-B directions in FIG. 3. FIG. 6 only illustrates a sectional structure of a thin film transistor and a capacitor in the display region 100, three test signal access pins in the first test signal access region 203a, and six signal access pins in the signal access region 202. However, no limits are made thereto in the present embodiment.

In some exemplary implementation modes, as shown in FIG. 6, in a plane perpendicular to the underlay substrate, the display region 100 includes the underlay substrate 10, and a driving structure layer and emitting element (not shown in the figure) which are sequentially arranged on the underlay substrate 10. The driving structure layer includes a pixel driving circuit connected with the emitting element. For example, the pixel driving circuit may be of a 7T1C or 5T1C structure. The driving structure layer includes a buffer layer 11, semiconductor layer, first gate insulating layer 12, first gate metal layer, second gate insulating layer 13, second gate metal layer, first Interlayer Dielectric (ILD) layer 14, and source and drain metal layer which are sequentially arranged on the underlay substrate 10. The semiconductor layer at least includes a first active layer of a first transistor 101. The first gate metal layer at least includes a first gate electrode of the first transistor 101 and a first capacitor electrode of a memory capacitor 102. The second gate metal layer at least includes a second capacitor electrode of the memory capacitor 102. The source and drain metal layer at least includes a first source electrode and first drain electrode of the first transistor 101.

In some exemplary implementation modes, as shown in FIG. 6, in a plane perpendicular to the underlay substrate, the signal access region 202 in the first border region includes the underlay substrate 10, and a buffer layer 11, first gate insulating layer 12, first signal access pin sub-layer, second gate insulating layer 13, first interlayer insulating layer 14, and second signal access pin sub-layer which are sequentially arranged on the underlay substrate 10. The first signal access pin sub-layer includes multiple first signal access sub-pins 2211 arranged in the first direction. The second signal access pin sub-layer includes multiple second signal access sub-pins 2212 arranged in the first direction. The signal access pin 221 in the signal access region 202 includes a first signal access sub-pin 2211 and second signal access sub-pin 2212 which are stacked and mutually connected. In some examples, an orthographic projection of the second signal access sub-pin 2212 on the underlay substrate 10 may be overlapped with an orthographic projection of the correspondingly connected first signal access sub-pin 2211 on the underlay substrate 10. In the present example, the first signal access pin sub-layer is in the same layer as the first gate metal layer of the display region 100, and the second signal access pin sub-layer is in the same layer as the source and drain metal layer of the display region 100. However, no limits are made thereto in the present embodiment.

In some exemplary implementation modes, as shown in FIG. 6, in a plane perpendicular to the underlay substrate, the first test signal access region 203a in the first border region includes the underlay substrate 10, and a buffer layer 11, first gate insulating layer 12, first test signal access pin sub-layer, second gate insulating layer 13, first interlayer insulating layer 14, second interlayer insulating layer 15, and second test signal access pin sub-layer which are sequentially arranged on the underlay substrate 10. The second interlayer insulating layer 15 in the present embodiment is the first insulating layer in the abovementioned embodiment. The first test signal access pin sub-layer includes multiple first test signal access sub-pins 2311 arranged in the first direction. The second test signal access pin sub-layer includes multiple second test signal access sub-pins 2312 arranged in the first direction. The test signal access pin 231 in the first test signal access region 203a includes a first test signal access sub-pin 2311 and second test signal access sub-pin 2312 which are stacked and mutually connected. In some examples, an orthographic projection of the second test signal access sub-pin 2312 on the underlay substrate 10 may be overlapped with an orthographic projection of the correspondingly connected first test signal access sub-pin 2311 on the underlay substrate 10. In the present example, the first test signal access pin sub-layer is in the same layer as the first gate metal layer of the display region 100, and the second test signal access pin sub-layer is in the same layer as the source and drain metal layer of the display region 100. However, no limits are made thereto in the present embodiment.

In some exemplary implementation modes, as shown in FIG. 6, a first height h1 between the surface of the test signal access pin layer away from the underlay substrate 10 (e.g., an upper surface of the second test signal access pin sub-layer) and the underlay substrate 10 is greater than a second height h2 between the surface of the signal access pin layer away from the underlay substrate 10 (e.g., an upper surface of the second signal access pin sub-layer) and the underlay substrate 10. In the present example, both the first height h1 and the second height h2 are based on the upper surface of the underlay substrate 10. However, no limits are made thereto in the present embodiment. For example, the first height and the second height may be based on the lower surface of the underlay substrate. In the present example, there is a height difference between the test signal access pin layer and the signal access pin layer, and the upper surface of the test signal access pin layer is farer away from the underlay substrate than the upper surface of the signal access pin layer. The height difference is set between the test signal access pin layer and the signal access pin layer, so that the test probe of the testing device only contacts with the test signal access pin when contacting with the test signal access pin in the ET process, and may be prevented from contacting with the signal access pin layer. Since the signal access pin layer is at a lower position, the test probe is suspended above the signal access pin layer without damaging the signal access pin layer even though deviated due to poor alignment, and the formation of a short-circuit between signal access pins may be avoided. Therefore, the yield of the display substrate may be improved.

In some exemplary implementation modes, the underlay substrate 10 may be a rigid substrate, e.g., a glass substrate. However, no limits are made thereto in the present embodiment. For example, the underlay substrate may be a flexible substrate, e.g., prepared from an insulating material like a resin. In addition, the underlay substrate may be a single-layer structure or a multilayer structure. When the underlay substrate is a multilayer structure, an inorganic material such as silicon nitride, silicon oxide, and silicon oxynitride may be arranged between multiple layers as one or more layers.

In some exemplary implementation modes, the buffer layer 11 covers the underlay substrate 10. The buffer layer 11 is an inorganic insulating layer prepared from an inorganic material. For example, the buffer layer may be made of any one or more inorganic materials of silicon oxide (SiOx), silicon nitride (SiNx), and silicon oxynitride (SiON), and may be single-layer, multilayer, or composite. In some examples, the buffer layer may be omitted according to the material and process condition of the underlay substrate.

In some exemplary implementation modes, the semiconductor layer is on the buffer layer. The semiconductor layer may be doped and patterned to form a channel region, source region, and drain region of a transistor, or form a line. For example, the channel region may be a semiconductor pattern doped with no impurity. The impurity may include, for example, an n-type impurity, a p-type impurity, and another metal impurity. The semiconductor layer may be made of one or more materials such as amorphous Indium Gallium Zinc Oxide (a-IGZO), zinc oxynitride (ZnON), indium zinc tin oxide (IZTO), amorphous silicon (a-Si), polysilicon (p-Si), sexithiophene, and polythiophene. That is, the embodiment of the present disclosure is applicable to a transistor manufactured based on an oxide technology, a silicon technology, or an organic matter technology.

In some exemplary implementation modes, the first gate insulating layer 12 covers the channel region, partial source region, and partial drain region of the semiconductor layer. The first gate insulating layer 12 is an inorganic insulating layer prepared from an inorganic material. The first gate insulating layer 12 may be made of any one or more inorganic materials of silicon oxide (SiOx), silicon nitride (SiNx), and silicon oxynitride (SiON), and may be single-layer, multilayer, or composite.

In some exemplary implementation modes, the first gate metal layer at least includes a first gate electrode of a first transistor 101 and a first capacitor electrode of a memory capacitor 102. A projection of the first gate electrode on the underlay substrate 10 is overlapped with a projection of the channel region on the underlay substrate 10. The first gate metal layer may be made of a metal material, e.g., any one or more of Argentum (Ag), Copper (Cu), Aluminum (Al), Titanium (Ti), and Molybdenum (Mo), or an alloy material of the abovementioned metals, e.g., an Aluminum-Neodymium alloy (AlNd) or a Molybdenum-Niobium alloy (MoNb), and may be a single-layer structure, or a multilayer composite structure such as Ti/Al/Ti.

In some exemplary implementation modes, the second gate insulating layer 13 may cover the first gate metal layer. The second gate insulating layer 13 is an inorganic insulating layer prepared from an inorganic material. The second gate insulating layer 13 may be made of any one or more inorganic materials of silicon oxide (SiOx), silicon nitride (SiNx), and silicon oxynitride (SiON), and may be single-layer, multilayer, or composite.

In some exemplary implementation modes, the second gate metal layer is on the second gate insulating layer 13, and at least includes a second capacitor electrode of the memory capacitor 102. A projection of the second capacitor electrode of the memory capacitor 102 on the underlay substrate 10 is overlapped with a projection of the first capacitor electrode on the underlay substrate 10. The second gate metal layer may be made of a metal material, e.g., any one or more of Argentum (Ag), Copper (Cu), Aluminum (Al), Titanium (Ti), and Molybdenum (Mo), or an alloy material of the abovementioned metals, e.g., an Aluminum-Neodymium alloy (AlNd) or a Molybdenum-Niobium alloy (MoNb), and may be a single-layer structure, or a multilayer composite structure such as Ti/Al/Ti.

In some exemplary implementation modes, the memory capacitor 102 consists of a first capacitor electrode and a second capacitor electrode. The second gate insulating layer 13 is arranged between the first capacitor electrode and the second capacitor electrode. FIG. 6 shows the capacitance condition of a two-layer electrode structure. However, no limits are made thereto in the present embodiment. In some examples, the memory capacitor may be constructed into a three-layer electrode structure using an active layer, or constructed into a three-layer electrode structure using an electrode in the same film layer as the source and drain metal layer, or constructed into an electrode structure with four or more layers.

In some exemplary implementation modes, the first interlayer insulating layer 14 may cover the second gate metal layer. The first interlayer insulating layer 14 may be an inorganic insulating layer prepared from an inorganic material. The first interlayer insulating layer 14 may be made of any one or more inorganic materials of silicon oxide (SiOx), silicon nitride (SiNx), and silicon oxynitride (SiON), and may be single-layer, multilayer, or composite.

In some exemplary implementation modes, the source and drain metal layer is on the first interlayer insulating layer 14, and at least includes a first source electrode and first drain electrode of a first transistor 101. The first source electrode may penetrate through vias formed in the first interlayer insulating layer 14, the second gate insulating layer 13, and the first gate insulating layer 12 to contact with the source region of the first active layer. The first drain electrode may penetrate through vias formed in the first interlayer insulating layer 14, the second gate insulating layer 13, and the first gate insulating layer 12 to contact with the drain region of the first active layer. The source and drain metal layer may be made of a metal material, e.g., any one or more of Argentum (Ag), Copper (Cu), Aluminum (Al), Titanium (Ti), and Molybdenum (Mo), or an alloy material of the abovementioned metals, e.g., an Aluminum-Neodymium alloy (AlNd) or a Molybdenum-Niobium alloy (MoNb), and may be a single-layer structure, or a multilayer composite structure such as Ti/Al/Ti.

In some exemplary implementation modes, the emitting element may include a first electrode, a second electrode, an organic layer, and a Pixel Definition Layer (PDL). In some examples, the first electrode may be an anode, and the second electrode may be a cathode. The first electrode is connected with the pixel driving circuit. The first electrode may be made of any one or more of argentum, magnesium (Mg), aluminum, Nickel (Ni), and chromium (Cr), or an alloy material of the abovementioned metals, or a transparent conductive material such as indium tin oxide (ITO), indium zinc oxide (IZO), zinc oxide (ZnO), and indium zinc tin oxide (IZTO). The first electrode may be a single-layer structure or a multilayer composite structure such as ITO/Ag/ITO. The second electrode may be made of any one or more of argentum, magnesium, aluminum, Ni, and Cr, or an alloy material of the abovementioned metals, or a transparent conductive material such as indium tin oxide (ITO), indium zinc oxide (IZO), zinc oxide (ZnO), and indium zinc tin oxide (IZTO). The second electrode may be made of an alloy of two metals (e.g., Ag and Mg). However, no limits are made thereto in the present embodiment. For example, the second electrode is the anode when the first electrode is the cathode.

In some exemplary implementation modes, the display substrate may be a top-emitting structure or a bottom-emitting structure. However, no limits are made thereto in the present embodiment.

In some exemplary implementation modes, the pixel definition layer in an emitting region of each sub-pixel is defined to be arranged on the underlay substrate where the first electrode is formed. The pixel definition layer exposes an upper surface of the first electrode, and protrudes from the underlay substrate in a circumferential direction of the sub-pixel. The organic layer may be arranged in a region, exposed by the pixel definition layer, of the sub-pixel. The pixel definition layer may be an organic insulating layer made of an organic material. The organic material may include an organic insulating material, e.g., a polyacrylic compound, a polyimide compound, a fluorine compound (e.g., Teflon), or a benzocyclobutene compound.

In some exemplary implementation modes, the organic layer may be arranged to be single-layer or include multiple layers with different functions. In some examples, the organic layer may include an Emitting Layer (EML), as well as one or more film layers in a Hole Injection Layer (HIL), a Hole Transport Layer (HTL), a Hole Block Layer (HBL), an Electron Block Layer (EBL), an Electron Injection Layer (EIL), and an Electron Transport Layer (ETL). The organic layer may be driven by voltages of the anode and the cathode to emit light according to a required gray-scale using the emitting characteristic of the organic material. In some examples, the organic layer may be formed by screen printing, ink-jet printing, Laser Induced Thermal Imaging (LITI), and other manners.

In some exemplary implementation modes, at least part of the organic layer may be formed integrally with multiple first electrodes, or may be arranged separately to correspond to each of multiple first electrodes.

In some exemplary implementation modes, the second electrode is arranged on the organic layer. For example, the second electrode may be arranged for each sub-pixel. Alternatively, the second electrode may be arranged to cover most of the display region and shared by multiple sub-pixels. However, no limits are made thereto in the present embodiment.

In some exemplary implementation modes, a package layer may be arranged on the second electrode. The package layer may be single-layer or multilayer. For example, the package layer may include a first package layer, second package layer, and third package layer which are sequentially stacked. The first package layer and the third package layer may be prepared from an inorganic material, and the second package layer may be prepared from an organic material. Compared with an organic material, an inorganic material is permeated with less moisture or oxygen, but is less elastic or flexible and thus easy to crack. The package layer of the inorganic/organic/inorganic stacked three-layer structure may prevent the propagation of the crack. The organic material may include an organic insulating material, e.g., a polyacrylic compound, a polyimide compound, a fluorine compound (e.g., Teflon), or a benzocyclobutene compound. The inorganic material may include an inorganic insulating material, e.g., polysiloxane, silicon nitride, silicon oxide, and silicon oxynitride. In some examples, the package layer may include multiple organic material layers and multiple inorganic material layers, which are alternately stacked.

In some exemplary implementation modes, as shown in FIGS. 5 and 6, the second interlayer insulating layer 15 is arranged in the test signal access region, and is on a side of the first interlayer insulating layer 14 away from the underlay substrate 10. The second interlayer insulating layer 15 includes multiple mutually isolated insulating portions 150 in one-to-one correspondence with the multiple second test signal access sub-pins 2312. Each insulating portion 150 is between the corresponding second test signal access sub-pin 2312 and the first interlayer insulating layer 14. As shown in FIGS. 5 and 6, a projection of each second test signal access sub-pin 2312 on the underlay substrate 10 is inside a projection of the corresponding insulating portion 150 on the underlay substrate 10. However, no limits are made thereto in the present embodiment. In some examples, adjacent insulating portions may be connected, and a height of a connecting region of the insulating portions is less than that of the insulating portion. Alternatively, at least part of insulating portions in the multiple insulating portions are mutually connected.

The structure of the display substrate of the present disclosure will now be described with reference to FIGS. 3 to 6 through an example of a preparation process of the display substrate. A "patterning process" mentioned in the present disclosure includes film layer deposition, coating with a photoresist, masking, exposure, development, etching, photoresist stripping, and other treatment. Deposition may be any one or more of sputtering, evaporation, and chemical vapor deposition. Coating may be any one or more of spray coating and spin coating. Etching may be any one or more of dry etching and wet etching. "Thin film" refers to a layer of thin film made from a certain material on a substrate by a deposition or coating process. If the patterning process is not needed by the "thin film" in the whole making process, the "thin film" may also be called a "layer". When the patterning process is further needed by the "thin film" in the whole making process, the thin film is called a "thin film" before the patterning process and called a "layer" after the patterning process. The "layer" after the patterning process includes at least one "pattern".

"A and B are in the same layer" mentioned in the present disclosure refers to that A and B are simultaneously formed by the same patterning process. "The same layer" does not always mean that the thickness of the layer or the height of the layer is the same in the sectional view. "The orthographic projection of A includes the orthographic projection of B" refers to that the orthographic projection of B falls in a range of the orthographic projection of A or the orthographic projection of A covers the orthographic projection of B.

In some exemplary implementation modes, the preparation process of the display substrate of the present embodiment may include the following Step (1) to Step (8).

In (1), an underlay substrate is provided.

In some exemplary implementation modes, the underlay substrate 10 is a rigid substrate, e.g., a glass substrate. However, no limits are made thereto in the present embodiment. For example, the underlay substrate is a flexible substrate.

In (2), a pattern of a semiconductor layer is prepared on the underlay substrate.

In some exemplary implementation modes, a first insulating thin film and a semiconductor thin film are sequentially deposited on the underlay substrate 10. The semiconductor thin film is patterned through the patterning process to form a buffer layer 11 covering the whole underlay substrate 10 and the pattern of the semiconductor layer arranged on the buffer layer 11. As shown in FIG. 6, the pattern of the semiconductor layer is formed in a display region 100, and at least includes a first active layer.

After the present process, the buffer layer 11 is formed on the underlay substrate 10 of a first test signal access region 203*a*, a second test signal access region 203*b*, and a signal access region 202.

In (3), a pattern of a first gate metal layer is prepared on the underlay substrate.

In some exemplary implementation modes, a second insulating thin film and a first metal thin film are sequentially deposited on the underlay substrate 10 where the abovementioned structures are formed. The first metal thin film is patterned through a patterning process to form a first gate insulating layer 12 covering the pattern of the semiconductor layer, and patterns of the first gate metal layer, a first test signal access pin sub-layer, and a first signal access pin sub-layer on the first gate insulating layer 12, as shown in FIG. 6. The pattern of the first gate metal layer is formed in the display region 100, and at least includes a first gate electrode and a first capacitor electrode. The pattern of the first test signal access pin sub-layer is formed in the first test signal access region 203*a* and the second test signal access region 203*b*, and at least includes multiple first test signal access sub-pins 2311. The pattern of the first signal access pin sub-layer is formed in the signal access region 202, and at least includes multiple first signal access sub-pins 2211.

In some exemplary implementation modes, a first alignment mark and fourth alignment mark of a first border region may be formed with the first gate metal layer through the same patterning process. However, no limits are made thereto in the present embodiment. For example, the first alignment mark to the fourth alignment mark may be in the same layer as a second gate insulating layer.

In (4), a pattern of a second gate metal layer is prepared on the underlay substrate.

In some exemplary implementation modes, a third insulating thin film and a second metal thin film are sequentially deposited on the underlay substrate 10 where the abovementioned structures are formed. The second metal thin film is patterned through a patterning process to form a second insulating layer 13 covering the patterns of the first gate metal layer, the first signal access pin sub-layer, and the first test signal access pin sub-layer and the first gate insulating layer 12, as well as the pattern of the second gate metal layer on the second gate insulating layer 13. As shown in FIG. 6, the pattern of the second gate metal layer is formed in the display region 100, and at least includes a second capacitor electrode.

After the present process, the buffer layer 11, first gate insulating layer 12, first test signal access pin sub-layer, and second gate insulating layer 13 which are stacked are formed on the underlay substrate 10 of the first test signal access region 203*a* and the second test signal access region 203*b*. The buffer layer 11, first gate insulating layer 12, first signal access pin sub-layer, and second gate insulating layer 13 which are stacked are formed on the underlay substrate 10 of the signal access region 202.

In (5), a pattern of a first interlayer insulating layer is prepared on the underlay substrate.

In some exemplary implementation modes, a fourth insulating thin film is deposited on the underlay substrate 10 where the abovementioned structures are formed. The fourth insulating thin film is patterned through a patterning process to form the pattern of the first interlayer insulating layer 14 covering the pattern of the second gate metal layer. As shown in FIG. 6, at least multiple first vias and multiple second vias are formed on the first interlayer insulating layer 14. The multiple first vias are in the display region 100 and expose the surface of the first active layer. The multiple second vias are in the signal access region 202 and expose the surface of the first signal access pin sub-layer.

After the present process, the buffer layer 11, first gate insulating layer 12, first test signal access pin sub-layer, second gate insulating layer 13, and first interlayer insulating layer 14 which are stacked are formed on the underlay substrate 10 of the first test signal access region 203*a* and the second test signal access region 203*b*. The buffer layer 11, first gate insulating layer 12, first signal access pin sub-layer, second gate insulating layer 13, and first interlayer insulating layer 14 which are stacked are formed on the underlay substrate 10 of the signal access region 202.

In (6), a pattern of a second interlayer insulating layer is prepared on the underlay substrate.

In some exemplary implementation modes, a fifth insulating thin film is deposited on the underlay substrate 10 where the abovementioned structures are formed. The fifth insulating thin film is patterned through a patterning process to form the pattern of the second interlayer insulating layer 15. As shown in FIG. 6, the second interlayer insulating layer 15 is formed in the first test signal access region 203*a* and the second test signal access region 203*b*. As shown in FIGS. 5 and 6, the second interlayer insulating layer 15 includes multiple mutually isolated insulating portions 150. The multiple insulating portions 150 are sequentially arranged in a first direction. Multiple third vias are formed on the second interlayer insulating layer 15 and expose the surface of the first test signal access pin sub-layer. In some examples, an orthographic projection of the second interlayer insulating layer 15 on the underlay substrate 10 may cover an orthographic projection of the first test signal access pin sub-layer on the underlay substrate 10.

In some exemplary implementation modes, a thickness of the second interlayer insulating layer 15 may be 1,500 to 4,500 angstroms. In the present exemplary implementation mode, the second interlayer insulating layer is arranged to form a height difference between a test signal access pin layer and a signal access pin layer.

Film layer structures of the display region 100 and the signal access region 202 are kept unchanged after the present process.

In (7), a source and drain metal layer, a second signal access pin sub-layer, and a second test signal access pin sub-layer are prepared on the underlay substrate.

In some exemplary implementation modes, a third metal thin film is deposited on the underlay substrate 10 where the abovementioned structures are formed. The third metal thin film is patterned through a patterning process to form a pattern of the source and drain metal layer on the first interlayer insulating layer 14 in the display region 100, a pattern of the second signal access pin sub-layer on the first interlayer insulating layer 14 in the signal access region 202, and a pattern of the second test signal access pin sub-layer on the second interlayer insulating layer 15 in the first test signal access region 203a and the second test signal access region 203b. As shown in FIG. 6, the pattern of the source and drain metal layer is formed in the display region 100, and at least includes patterns of a first source electrode, a first drain electrode, and multiple data lines (not shown). The first source electrode and the first drain electrode are connected with a source region and drain region of the first active layer through the first vias respectively. The second signal access pin sub-layer is formed in the signal access region 202, and at least includes multiple second signal access sub-pins 2212 which are sequentially arranged in the first direction. The second test signal access pin sub-layer is formed in the first test signal access region 203a and the second test signal access region 203b, and at least includes multiple second test signal access sub-pins 2312 which are sequentially arranged in the first direction. The second signal access sub-pins 2212 are connected with the corresponding first signal access sub-pins 2211 through the second vias. The second test signal access sub-pins 2312 are connected with the corresponding first test signal access sub-pins 2311 through the third vias.

As shown in FIG. 6, a projection of each second test signal access sub-pin 2312 on the underlay substrate 10 is inside a projection of the corresponding insulating portion 150 on the underlay substrate 10. A projection of the first test signal access sub-pin 2311 corresponding to the second test signal access sub-pin 2312 is also inside the projection of the corresponding insulating portion 150 on the underlay substrate 10. However, no limits are made thereto in the present embodiment.

At this moment, the preparation of a driving structure layer in the display region 100 on the underlay substrate 10 is completed, as shown in FIG. 6. In the driving structure layer in the display region 100, the first active layer, the first gate electrode, the first source electrode, and the first drain electrode form a first transistor 101, and the first capacitor electrode and the second capacitor electrode form a memory capacitor 102.

In some exemplary implementation modes, each of the first insulating thin film to the fifth insulating thin film is made of an inorganic material, e.g., any one or more of silicon oxide (SiOx), silicon nitride (SiNx), and silicon oxynitride (SiON), and may be single-layer, multilayer, or composite.

In (8), a planar layer, an emitting element, and a package layer are sequentially prepared on the underlay substrate.

In some exemplary implementation modes, the underlay substrate 10 where the abovementioned structures are formed is coated with a planar thin film to form the planar layer. The planar layer is patterned through a patterning process to expose the surface of the first drain electrode of the first transistor 101. Then, a first conductive thin film is deposited, and the first conductive thin film is patterned through a patterning process to form a pattern of a first electrode. The first electrode is connected with the first drain electrode of the thin film transistor through a via on the planar layer. Then, coating with a pixel definition thin film is performed, and a pattern of a pixel definition layer is formed by masking, exposure and development processes. The pixel definition layer is formed in the display region. A pixel opening is formed on the pixel definition layer in the display region. The pixel definition thin film in the pixel opening is removed by development to expose the surface of the first electrode. Then, an organic layer and a second electrode are sequentially formed on the underlay substrate where the abovementioned structures are formed. For example, the organic layer includes a hole injection layer, hole transport layer, emitting layer, electron transport layer, and electron injection layer which are stacked, and is formed in the pixel opening of the display region, to connect the organic layer with the first electrode. The first electrode is connected with the first drain electrode of the first transistor to implement emitting control over the organic layer. The second electrode is partially formed on the organic layer.

In some exemplary implementation modes, the package layer is formed on the underlay substrate where the abovementioned patterns are formed. The package layer may be formed in the display region, and may adopt a stacked structure of inorganic material/organic material/inorganic material. An organic material layer is arranged between two inorganic material layers. Film layer structures of the signal access region and the test signal access region are kept unchanged after the present patterning process.

In some exemplary implementation modes, the planar layer and the pixel definition layer may be made of an organic material such as polyimide, acrylic, or polyethylene terephthalate.

In the abovementioned preparation process, preparation processes of a test unit, scan driver, and emission driver in a second border region are similar to the preparation process of the driving structure layer in the display region, and thus will not be elaborated herein.

The preparation process of the present exemplary embodiment may be implemented using an existing mature preparation device, and is compatible well with an existing preparation process, simple in process implementation, easy to implement, high in production efficiency and yield, and low in production cost.

The structure of the display substrate of the present exemplary embodiment and the preparation process thereof are described only as an example. In some exemplary implementation modes, changes in corresponding structures and addition or deletion of the patterning process may be made as practically required. For example, a first source and drain metal layer and a second source and drain metal layer may be arranged in the display region. The first source and drain metal layer may include the first source electrode and first drain electrode of the first transistor. The second source and drain metal layer may include a connecting electrode between the emitting element and the first drain electrode. The second signal access pin sub-layer and the second test signal access pin sub-layer may be in the same layer as the second source and drain metal layer. For another example, the signal access pin layer may include three signal access pin sub-layers which are stacked and mutually connected, and the test signal access pin layer may include three test signal access pin sub-layers which are stacked and mutually connected. However, no limits are made thereto in the present embodiment.

In the present exemplary implementation mode, the first insulating layer is arranged in the test signal access region to form the height difference between the test signal access pin layer and the signal access pin layer, so that the test probe of the testing device only contacts with the test signal access pin layer in the ET process, and the signal access pin layer is prevented from being bruised or scratched by the test probe. Therefore, the yield loss is reduced.

The structure (or method) shown in the present implementation mode may be combined with structures (or methods) shown in other implementation modes as appropriate.

Figure 7:
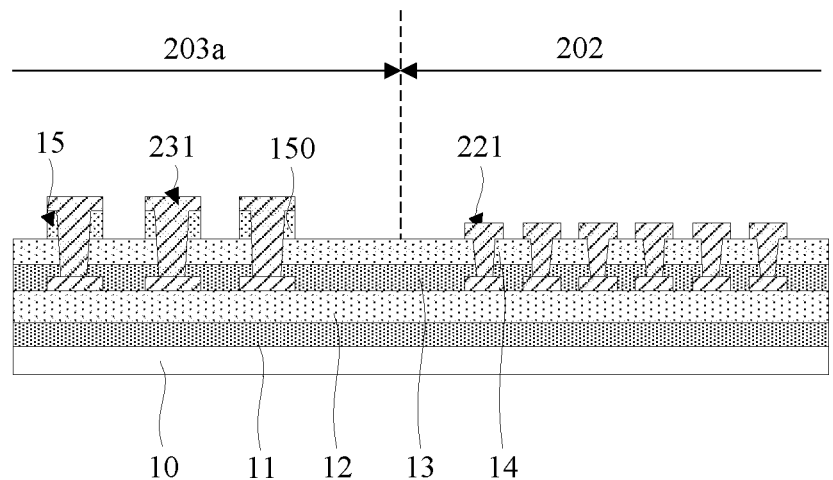
FIG. 7 is a schematic diagram of another partial sectional view along B-B direction in FIG. 3.

FIG. 7 is a schematic diagram of another sectional view along B-B direction in FIG. 3. In some exemplary implementation modes, as shown in FIG. 7, the second interlayer insulating layer 15 in the test signal access region (e.g., the first test signal access region 203a) includes multiple mutually isolated insulating portions 150. The multiple insulating portions 150 are in one-to-one correspondence with the multiple test signal access pins 231. A projection of the insulating portion 150 on the underlay substrate 10 is overlapped with a projection of the corresponding test signal access pin 231 on the underlay substrate. In the present example, the test signal access pin 231 includes two test signal access sub-pins which are stacked and connected, and the signal access pin 221 includes two signal access sub-pins which are stacked and connected.

Other structures of the test signal access pin, signal access pin, display region, and first border region in the present exemplary embodiment are similar to the corresponding structures described in the abovementioned embodiment, and thus will not be elaborated herein.

The structure (or method) shown in the present implementation mode may be combined with structures (or methods) shown in other implementation modes as appropriate.

Figure 8:
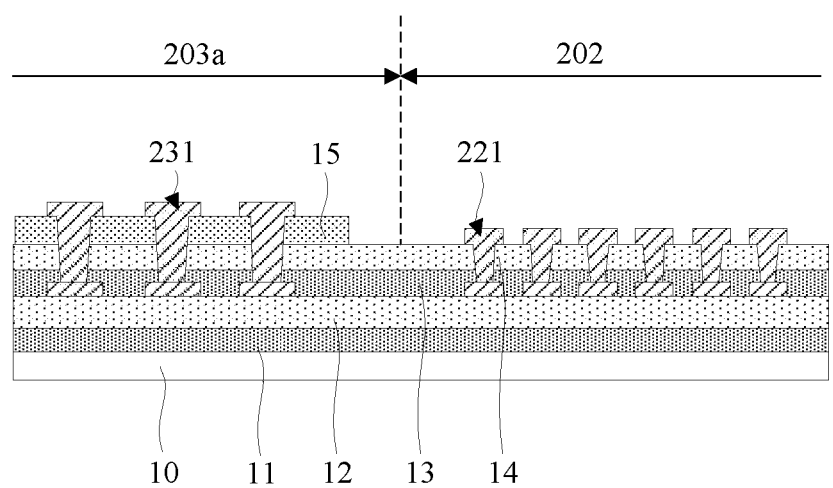
FIG. 8 is a schematic diagram of another partial sectional view along B-B direction in FIG. 3.

FIG. 8 is a schematic diagram of another sectional view along B-B direction in FIG. 3. In some exemplary implementation modes, as shown in FIG. 8, the second interlayer insulating layer 15 may cover the first test signal access region 203a and the second test signal access region 203b. The second interlayer insulating layer 15 is not arranged in a region except the first test signal access region 203a and the second test signal access region 203b. The projections of the multiple test signal access pins 231 on the underlay substrate 10 are inside the projection of the second interlayer insulating layer 15 on the underlay substrate 10. In the present example, the test signal access pin 231 includes two test signal access sub-pins which are stacked and connected, and the signal access pin 221 includes two signal access sub-pins which are stacked and connected.

Other structures of the test signal access pin, signal access pin, display region, and first border region in the present exemplary embodiment are similar to the corresponding structures described in the abovementioned embodiment, and thus will not be elaborated herein.

The structure (or method) shown in the present implementation mode may be combined with structures (or methods) shown in other implementation modes as appropriate.

Figure 9:
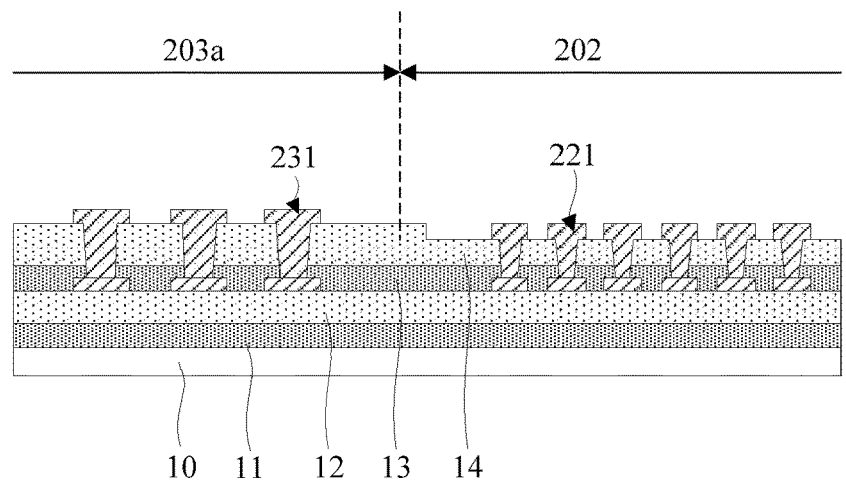
FIG. 9 is a schematic diagram of another partial sectional view along B-B direction in FIG. 3.

FIG. 9 is a schematic diagram of another sectional view along B-B direction in FIG. 3. In some exemplary implementation modes, as shown in FIG. 9, the test signal access pin 231 includes a first test signal access sub-pin and second test signal access sub-pin which are stacked and connected. The signal access pin 221 includes a first signal access sub-pin and second signal access sub-pin which are stacked and connected. The second signal access sub-pins of the multiple signal access pins 221 in the signal access region 202 are on the first interlayer insulating layer 14. The second test signal access sub-pins of the multiple test signal access pins 231 in the test signal access region (e.g., the first test signal access region 203a) are also on the first interlayer insulating layer 14. A thickness of the first interlayer insulating layer 14 in the test signal access region is greater than that in the signal access region 202. For example, the signal access region may be channeled in the preparation process of the first interlayer insulating layer to make the thickness of the first interlayer insulating layer in the signal access region less than that in the test signal access region. The first interlayer insulating layer in the present exemplary implementation mode is the second insulating layer in the abovementioned embodiment.

In the present exemplary implementation mode, the first insulating layer in the test signal access region and the signal access region is set to be different in thickness to form the height difference between the test signal access pin layer and the signal access pin layer, so that the test probe of the testing device only contacts with the test signal access pin layer in the ET process, and the signal access pin layer is prevented from being bruised or scratched by the test probe. Therefore, the yield loss is reduced.

Other structures of the test signal access pin, signal access pin, display region, and first border region in the present exemplary embodiment are similar to the corresponding structures described in the abovementioned embodiment, and thus will not be elaborated herein.

The structure (or method) shown in the present implementation mode may be combined with structures (or methods) shown in other implementation modes as appropriate.

Figure 10:
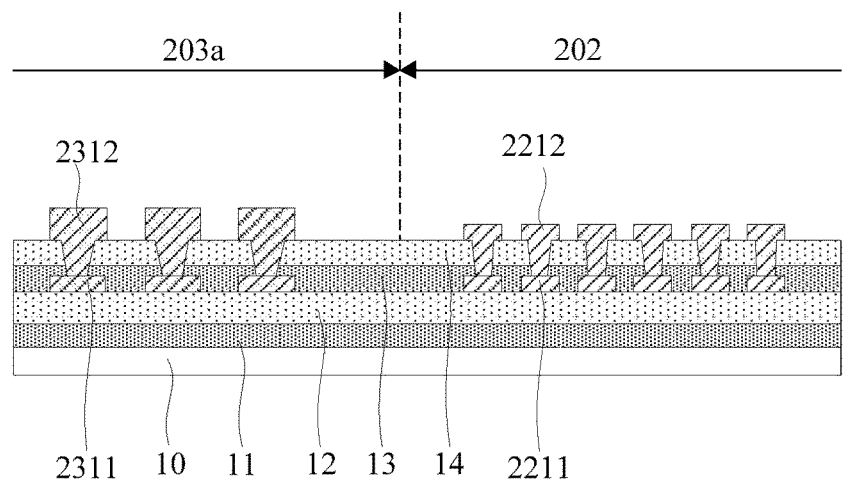
FIG. 10 is a schematic diagram of another partial sectional view along B-B direction in FIG. 3.

FIG. 10 is a schematic diagram of another sectional view along B-B direction in FIG. 3. In some exemplary implementation modes, as shown in FIG. 10, the test signal access pin includes a first test signal access sub-pin 2311 and second test signal access sub-pin 2312 which are stacked and connected. The signal access pin includes a first signal access sub-pin 2211 and second signal access sub-pin 2212 which are stacked and connected. The thickness of the second test signal access sub-pin 2312 in the test signal access region (e.g., the first test signal access region 203a) is greater than that of the second signal access sub-pin 2212 in the signal access region 202. The thickness of the first test signal access sub-pin 2311 may be substantially the same as that of the first signal access sub-pin 2212. In some examples, the second test signal access pin sub-layer may be formed after the second signal access pin sub-layer is formed on the underlay substrate 10. The second signal access pin sub-layer may be prepared with the source and drain metal layer in the display region through the same patterning process. Alternatively, the second test signal access pin sub-layer may be prepared with the source and drain metal layer in the display region through the same patterning process. In some other examples, the second signal access pin sub-layer may be formed after the second test signal access pin sub-layer is formed on the underlay substrate 10. However, no limits are made thereto in the present embodiment. In the present exemplary implementation mode, the second test signal access pin sub-layer and the second signal access pin sub-layer are set to be different in thickness to form the height difference between the test signal access pin layer and the signal access pin layer, so that the test probe of the testing device only contacts with the test signal access pin layer in the ET process, and the signal access pin layer is prevented from being bruised or scratched by the test probe. Therefore, the yield loss is reduced.

Other structures of the test signal access pin, signal access pin, display region, and first border region in the present exemplary embodiment are similar to the corresponding structures described in the abovementioned embodiment, and thus will not be elaborated herein.

The structure (or method) shown in the present implementation mode may be combined with structures (or methods) shown in other implementation modes as appropriate.

At least one embodiment of the present disclosure also provides a preparation method of a display substrate, which is used for preparing the display substrate of the abovementioned embodiment and includes: forming a test signal access pin layer in a test signal access region of an underlay substrate, and forming a signal access pin layer in a signal access region of the underlay substrate. A height difference between a surface of the test signal access pin layer away from the underlay substrate and a surface of the signal access pin layer away from the underlay substrate is greater than 0.

In some exemplary implementation modes, the abovementioned preparation method further includes: forming a first insulating layer in the test signal access region before the test signal access pin layer is formed. A projection of the first insulating layer on the underlay substrate includes a projection of the test signal access pin layer on the underlay substrate. For example, the test signal access pin layer includes a first test signal access pin sub-layer and second test signal access pin sub-layer which are stacked. The first insulating layer is formed in the test signal access region after the first test signal access pin sub-layer is formed and before the second test signal access pin sub-layer is formed. However, no limits are made thereto in the present embodiment.

In some exemplary implementation modes, the abovementioned preparation method further includes: forming a second insulating layer in the signal access region and the test signal access region before the test signal access pin layer and the signal access pin layer are formed. A thickness of the second insulating layer in the test signal access region is greater than that in the signal access region. For example, the test signal access pin layer includes a first test signal access pin sub-layer and second test signal access pin sub-layer which are stacked, and the signal access pin layer includes a first signal access pin sub-layer and second signal access pin sub-layer which are stacked. The second insulating layer is formed in the signal access region and the test signal access region after the first test signal access pin sub-layer and the first signal access pin sub-layer are formed and before the second test signal access pin sub-layer and the second signal access pin sub-layer are formed. However, no limits are made thereto in the present embodiment.

In some exemplary implementation modes, a thickness of the test signal access pin layer is greater than that of the signal access pin layer.

The preparation method of the present exemplary embodiment may refer to the related descriptions in the abovementioned embodiments, and thus will not be elaborated herein.

Figure 11:
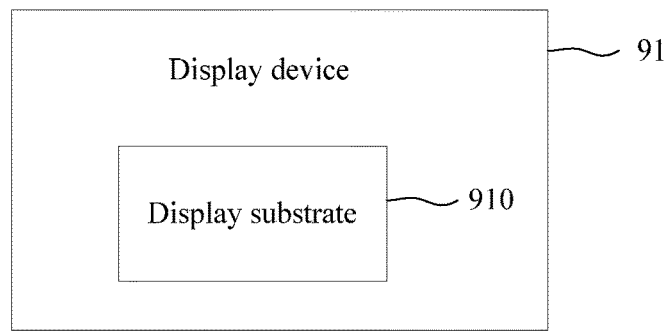
FIG. 11 is a schematic diagram of a display device according to at least one embodiment of the present disclosure.

FIG. 11 is a schematic diagram of a display device according to at least one embodiment of the present disclosure. As shown in FIG. 11, the present embodiment provides a display device 91, which includes a display substrate 910. The display substrate 910 is the display substrate provided in the abovementioned embodiments. Herein, the display substrate 910 may be an OLED display substrate. The display device 91 may be any product or component with a display function, such as an OLED display device, a mobile phone, a tablet computer, a television, a display, a notebook computer, a digital photo frame, and a navigator. However, no limits are made thereto in the present embodiment.

The drawings of the present disclosure only involve the structures involved in the present disclosure, and the other structures may refer to conventional designs. The embodiments in the present disclosure, i.e., the features in the embodiments, can be combined without conflicts to obtain new embodiments.

Those of ordinary skill in the art should know that modifications or equivalent replacements may be made to the technical solutions of the present disclosure without departing from the spirit and scope of the technical solutions of the present disclosure, and shall all fall within the scope of the claims of the present disclosure.

What is claimed is:

1. A display substrate, comprising:
   an underlay substrate, comprising a display region and a border region at a periphery of the display region, the border region comprising a fan-out region at one side of the display region, a signal access region and at least one test signal access region at one side of the fan-out region away from the display region, the at least one test signal access region being adjacent to the signal access region;
   multiple sub-pixels in the display region;
   multiple data lines in the display region, the multiple data lines being electrically connected with the multiple sub-pixels and arranged to provide data signals for the multiple sub-pixels;
   multiple signal fan-out lines in the fan-out region, the multiple signal fan-out lines comprising multiple data fan-out lines connected with the multiple data lines in one-to-one correspondence;
   a test signal access pin layer in the at least one test signal access region, the test signal access pin layer comprising multiple test signal access pins arranged to contact with a test probe of a testing device in an electronic test process; and
   a signal access pin layer in the signal access region, the signal access pin layer comprising multiple signal access pins arranged to form bonding connections with a flexible printed circuit or an integrated circuit, the multiple signal access pins comprising multiple first signal access pins and multiple second signal access pins, the multiple first signal access pins being connected with multiple power lines in the fan-out region, at least part of the multiple second signal access pins being connected with the multiple signal fan-out lines,
   wherein a height difference between a surface of the test signal access pin layer away from the underlay substrate and a surface of the signal access pin layer away from the underlay substrate is greater than 0.

2. The display substrate according to claim 1, wherein the multiple signal access pins are arranged abreast in parallel; and
   the at least one test signal access region is at one or more sides of the multiple signal access pins in an arrangement direction of the multiple signal access pins.

3. The display substrate according to claim 2, wherein the multiple test signal access pins are, arranged in parallel with the multiple signal access pins.

4. The display substrate according to claim 1, further comprising a first insulating layer, arranged in the at least one test signal access region and located on a side of the test signal access pin layer close to the underlay substrate, wherein a projection of the first insulating layer on the underlay substrate comprises a projection of the test signal access pin layer on the underlay substrate.

5. The display substrate according to claim 4, wherein the first insulating layer comprises multiple mutually isolated insulating portions in one-to-one correspondence with the multiple test signal access pins of the test signal access pin layer, and a projection of an insulating portion on the underlay substrate comprises a projection of a corresponding test signal access pin on the underlay substrate.

6. The display substrate according to claim 5, wherein the first insulating layer is an inorganic insulating layer.

7. The display substrate according to claim 4, wherein the first insulating layer is an inorganic insulating layer.

8. The display substrate according to claim 1, further comprising a second insulating layer, arranged in the test signal access region and the signal access region and located on sides of the test signal access pin layer and the signal access pin layer close to the underlay substrate, wherein a thickness of the second insulating layer in the test signal access region is greater than that in the signal access region.

9. The display substrate according to claim 8, wherein the second insulating layer is an inorganic insulating layer.

10. The display substrate according to claim 1, wherein the test signal access pin layer comprises multiple test signal access pin sub-layers which are stacked and mutually connected, and the signal access pin layer comprises multiple signal access pin sub-layers which are stacked and mutually connected; and the multiple test signal access pin sub-layers are in one-to-one correspondence with the multiple signal access pin sub-layers, and a test signal access pin sub-layer and a corresponding signal access pin sub-layer are in a same layer.

11. The display substrate according to claim 1, wherein a thickness of the test signal access pin layer is greater than that of the signal access pin layer.

12. The display substrate according to claim 1, wherein the height difference between the surface of the test signal access pin layer away from the underlay substrate and the surface of the signal access pin layer away from the underlay substrate is about 1,500 to 4,500 angstroms.

13. The display substrate according to claim 1, wherein the display region at least comprises a driving structure layer arranged on the underlay substrate;
the driving structure layer comprises a semiconductor layer, first gate metal layer, second gate metal layer, and source and drain metal layer which are sequentially arranged on the underlay substrate;
the test signal access pin layer comprises a first test signal access pin sub-layer and a second test signal access pin sub-layer which are stacked and mutually connected, and the signal access pin layer comprises a first signal access pin sub-layer and a second signal access pin sub-layer which are stacked and mutually connected;
the first test signal access pin sub-layer, the first signal access pin sub-layer, and the first gate metal layer are in a same layer; and
the second test signal access pin sub-layer, the second signal access pin sub-layer, and the source and drain metal layer are in a same layer.

14. A display device, comprising the display substrate according to claim 1.

15. A preparation method of a display substrate, for preparing the display substrate according to claim 1, the preparation method comprising:
forming a test signal access pin layer in a test signal access region of an underlay substrate, and forming a signal access pin layer in a signal access region of the underlay substrate, wherein a height difference between a surface of the test signal access pin layer away from the underlay substrate and a surface of the signal access pin layer away from the underlay substrate is greater than 0.

16. The preparation method according to claim 15, further comprising: forming a first insulating layer in the test signal access region before forming the test signal access pin layer, wherein a projection of the first insulating layer on the underlay substrate comprises a projection of the test signal access pin layer on the underlay substrate.

17. The preparation method according to claim 15, further comprising: forming a second insulating layer in the signal access region and the test signal access region before forming the test signal access pin layer and the signal access pin layer, wherein a thickness of the second insulating layer in the test signal access region is greater than that in the signal access region.

18. The preparation method according to claim 15, wherein a thickness of the test signal access pin layer is greater than that of the signal access pin layer.

* * * * *